United States Patent
Krietzman et al.

(10) Patent No.: US 6,755,493 B1
(45) Date of Patent: Jun. 29, 2004

(54) WALL MOUNTED CABINET HAVING IMPROVED HINGE DESIGN

(75) Inventors: William Drew Krietzman, Elk, WA (US); Enrie Rillo Ballesteros, Northridge, CA (US)

(73) Assignee: Chatsworth Products, Inc., Westlake Village, CA (US)

( * ) Notice: Subject to any disclaimer, the term of this patent is extended or adjusted under 35 U.S.C. 154(b) by 22 days.

(21) Appl. No.: 09/955,862

(22) Filed: Sep. 19, 2001

Related U.S. Application Data
(60) Provisional application No. 60/233,702, filed on Sep. 19, 2000.

(51) Int. Cl.[7] .............................................. A47B 67/02
(52) U.S. Cl. ...................... 312/248; 312/293.3; 16/265
(58) Field of Search .......................... 16/229, 262, 265, 16/261; 312/405, 248, 257.1, 293.3; 49/382, 388

(56) References Cited

U.S. PATENT DOCUMENTS

| | | | | |
|---|---|---|---|---|
| 2,916,591 A | | 12/1959 | Benn ........................... 200/168 |
| 3,895,179 A | | 7/1975 | Wyatt ........................... 174/50 |
| 4,620,392 A | * | 11/1986 | Kerpers et al. ............... 49/382 |
| 4,699,289 A | | 10/1987 | You ............................. 220/3.7 |
| 5,148,348 A | | 9/1992 | White ......................... 361/356 |
| 5,165,770 A | * | 11/1992 | Hahn ....................... 312/265.4 |
| 5,561,886 A | * | 10/1996 | Flamme ........................ 16/265 |
| 5,568,362 A | | 10/1996 | Hansson ...................... 361/736 |
| 5,570,940 A | * | 11/1996 | Maro ....................... 312/257.1 |
| 5,788,351 A | * | 8/1998 | Prunty et al. ................ 312/326 |
| 5,940,937 A | * | 8/1999 | Churchill et al. ............. 16/382 |
| 6,085,385 A | | 7/2000 | Joo .............................. 16/268 |
| 6,128,807 A | | 10/2000 | Lim et al. ..................... 16/266 |
| 6,152,554 A | | 11/2000 | Parisi ......................... 312/405 |

* cited by examiner

Primary Examiner—Lanna Mai
Assistant Examiner—Jerry A. Anderson
(74) Attorney, Agent, or Firm—Kennedy Covington Lobdell & Hickman, LLP

(57) ABSTRACT

A wall mounted cabinet with an improved hinge design having a mounting frame, a cabinet body and a pair of improved hinge apparatus. The hinge apparatus includes a hinge shaft attachable to a side of the mounting frame in such a manner that the hinge shaft is slidably adjusted along the mounted frame side and a hinge plate attached to the cabinet body. The hinge shafts can engage the hinge plates, securing the cabinet body to the mounting frame, or disengage the hinge plate, thereby allowing the removal of the cabinet body from the mounting frame. Fasteners secure the hinge shafts to the side of the mounting frame and maintain the hinge shafts in the desired position. The fasteners can only be removed from the inside of the cabinet, thereby providing a secure enclosure when the cabinet body is attached to the mounting frame and secured.

23 Claims, 8 Drawing Sheets

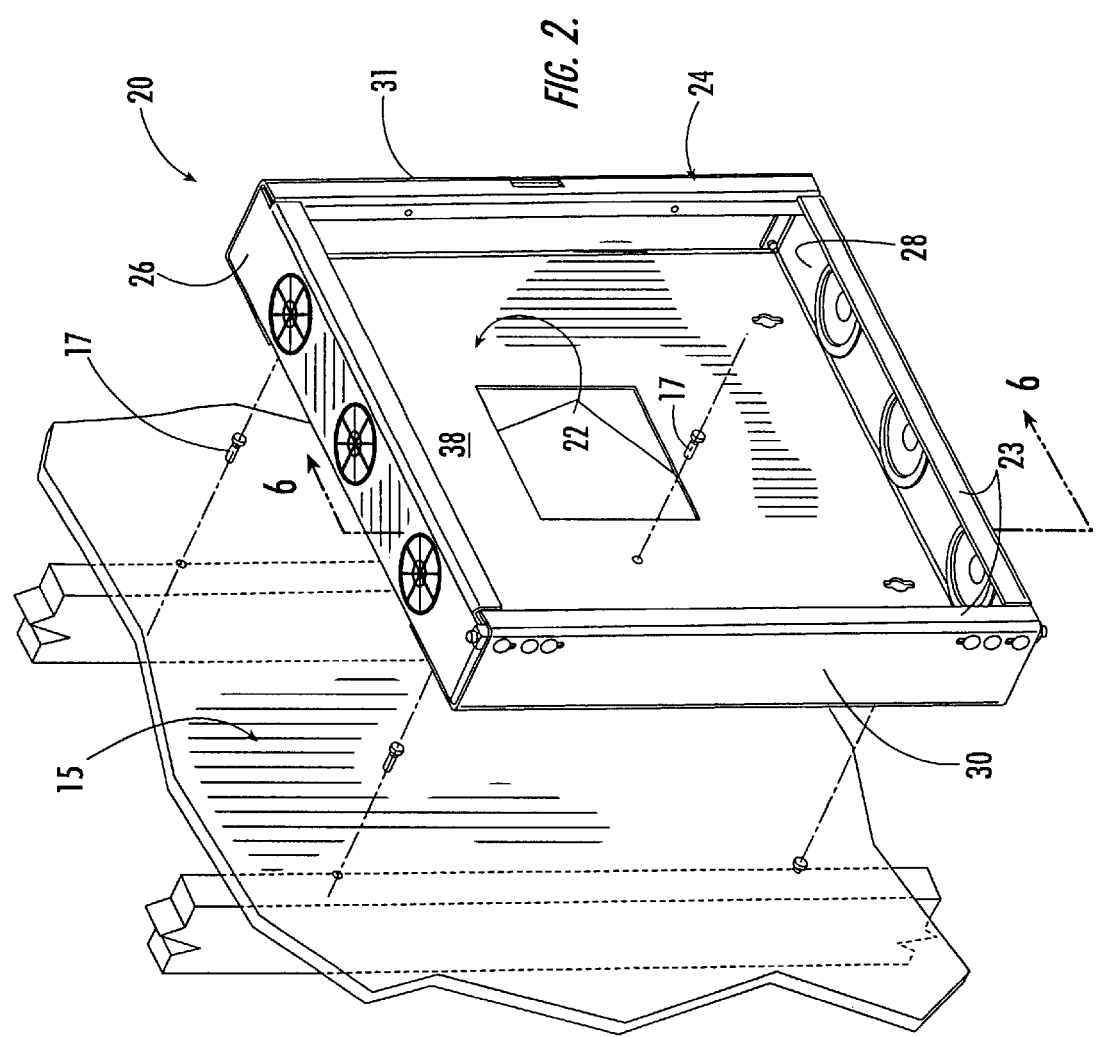

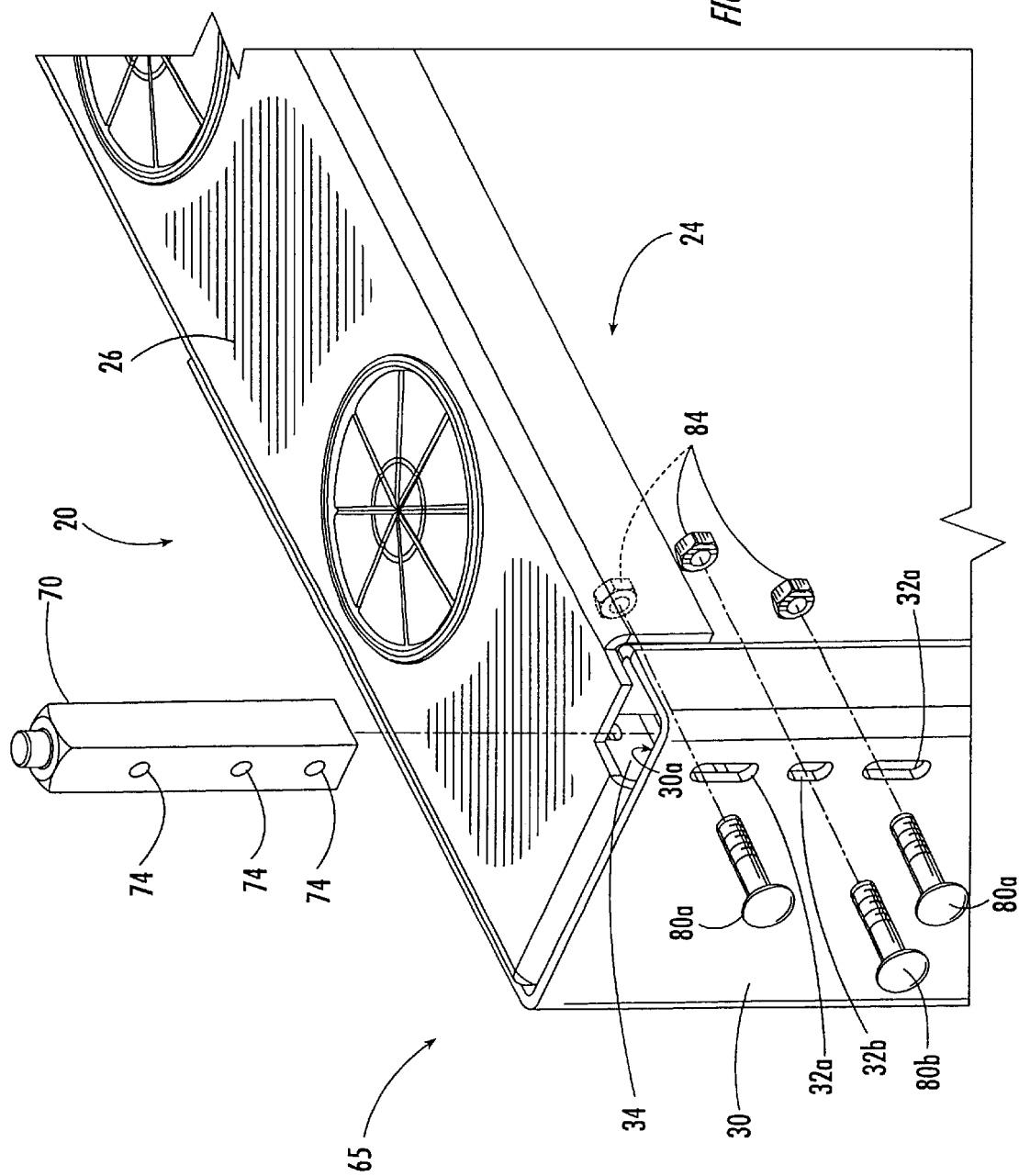

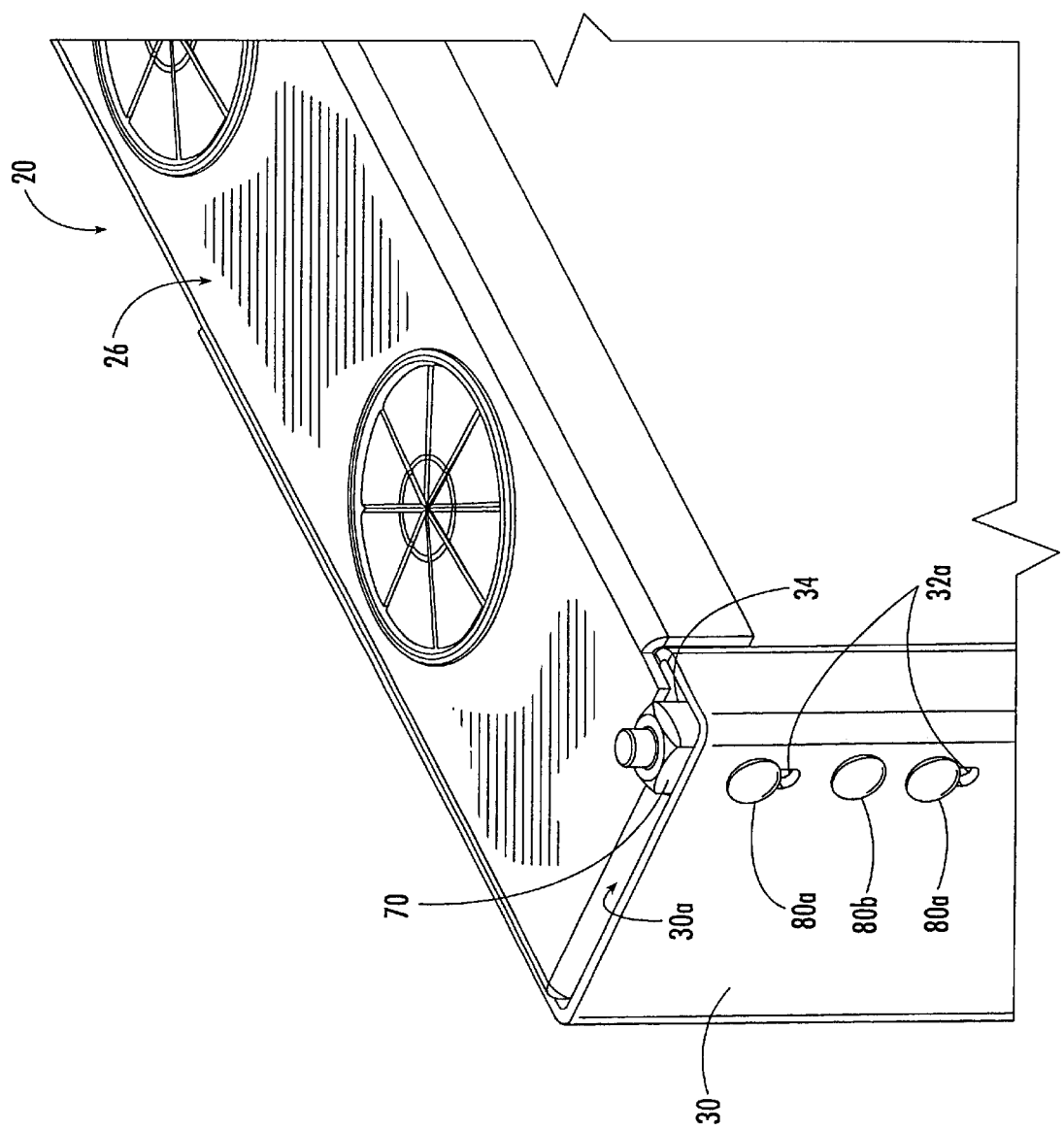

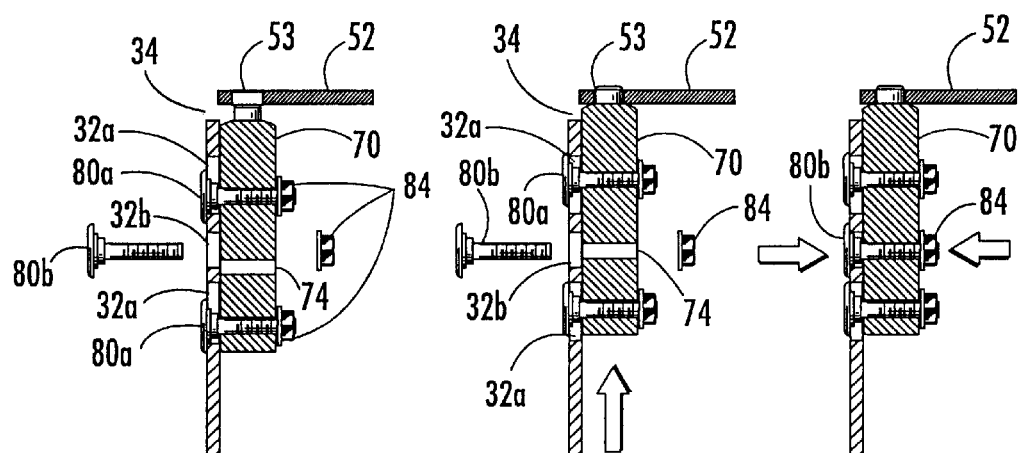
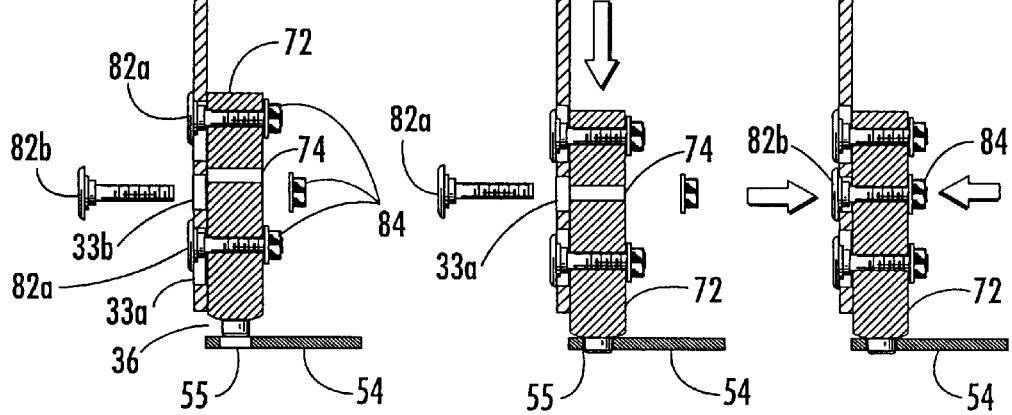
FIG. 6a. FIG. 6b. FIG. 6c.

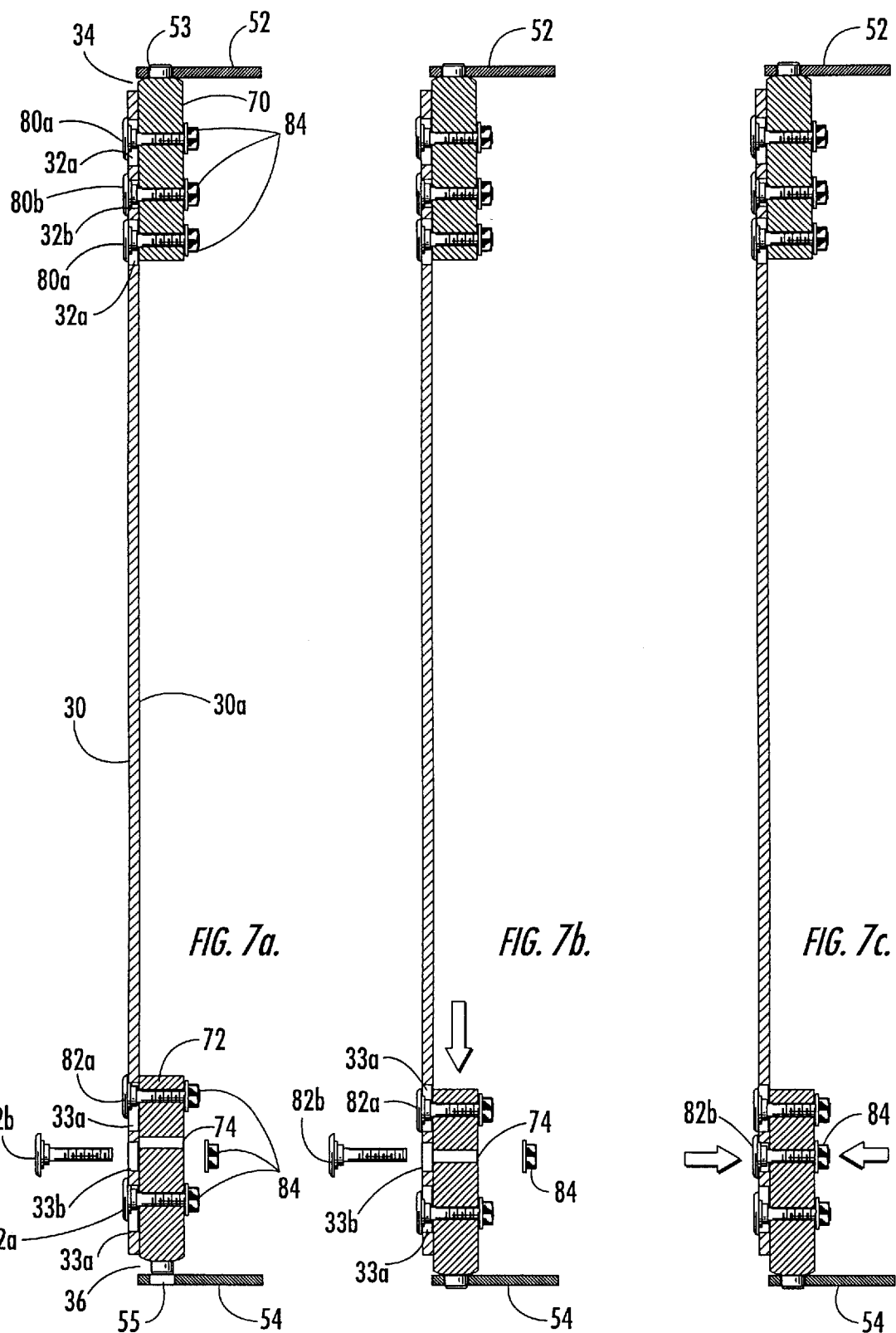

WALL MOUNTED CABINET HAVING IMPROVED HINGE DESIGN

CROSS REFERENCE TO RELATED APPLICATION

This application claims the benefit of U.S. Provisional Patent Application No. 60/233,702, filed Sep. 19, 2000, incorporated herein by reference.

FIELD OF THE INVENTION

The present invention relates to wall mounted cabinets and, in particular, a wall mounted cabinet having any improved hinge design in which a cabinet body is easily attached and detached at the hinge from a frame mounted to the wall.

BACKGROUND OF THE INVENTION

Wall mounted cabinets for storing or housing equipment, electrical or otherwise, having some form of a mounting frame on which the main cabinet body is attached are known. For example U.S. Pat. No. 5,568,362, discloses a cabinet for housing electrical equipment. The cabinet has a back door mounted to a wall, a central casing attached to the back door by at least one hinge, and a front door. The central casing can be rotated away from the back door and, hence, the wall, by the hinge. However, this construction does not provide for the complete detachment of the central casing from the back door. Thus, a need exists for a cabinet in which the central body is completely detachable from a mounting frame to provide adequate space in which to access equipment housed within the cabinet and also allow for easier mounting of the cabinet frame and body.

Another type of wall mounted cabinet is disclosed in U.S. Pat. No. 4,699,289, which teaches a cabinet body that is detachable from the wall mounted frame. In this construction, a box body is attached to the wall by an H-frame. A mounting frame is attached to an assembly plate which is attached to the interior of the box body. The frame body fits inside and is attached to the mounting frame. The construction prevents the box body from being deformed when mounted during ongoing construction. However, this patent does not teach or suggest having a box body, or cabinet, that is readily detachable from the wall mounting once the construction is complete, nor is the use of hinges to provide access to the equipment housed within the cabinet taught or suggested. Thus the need exists for a cabinet that has a readily accessible, yet secure, interior.

In U.S. Pat. No. 2,916,591, a detachable cabinet body is disclosed. However, the cabinet body in this construction detaches by sliding the cabinet body over two side flanges that are attached to the wall. The use of hinges to detach the cabinet from the wall is not taught by this construction.

OBJECT AND SUMMARY OF THE INVENTION

The object of the present invention is to provide a device for easily attaching and detaching a cabinet body from a wall-mounted frame yet maintain a secure environment for the equipment housed therein when the cabinet body is attached to the wall-mounted frame.

This object is attained by having hinge apparatus attach the cabinet body to a mounting frame which is attached to a wall or other solid object. The hinge apparatus allow the cabinet body to be rotated away from the mounting frame to provide entry to the interior of the cabinet body. The hinge apparatus also permit the cabinet body to be completely detached from the mounting frame. A front cover is attached to the cabinet body opposite the mounting frame so that the contents of the cabinet, for example electrical equipment, are completely enclosed and protected from the surrounding environment and secure against intrusion.

In a specific embodiment of the present invention, the cabinet body is attached to the mounting frame by two hinge apparatus—one at the top of the cabinet and one located at the bottom of the cabinet. Each of the hinge apparatus has a hinge assembly and a hinge plate. The hinge assembly has a set of three vertically aligned frame holes penetrating the same side of the mounting frame. The holes have a rectangular cross-section. Each hinge assembly also includes a hinge shaft having two portions—one with a square cross-section (referred to hereafter as the "square portion") and one with a circular cross-section (referred to hereafter as the "cylindrical portion"). Three vertically aligned holes extend the entire width of the square portion of each hinge shaft, the spacing of the holes corresponding to the spacing of the holes in the mounting frame. Each hinge shaft has associated with it three attachment fasteners, e.g., bolts, that pass through the sets of holes in the mounting frame and into the holes in the hinge shafts. Fastener retainers, e.g., nuts, are attached to the fasteners, securing the hinge shafts to the mounting frame. The outer frame holes, e.g. the top and bottom holes of each set of frame holes, are shaped as vertical slots, allowing the corresponding outer fasteners, e.g., the top and bottom bolts, to slide along the length of the slots. Thus, the hinge shafts attached to the mounting frame by the fasteners also slides a distance equal to the length of the slots in the mounting frame. The inner frame holes, e.g., the center hole, are conventional holes, i.e., not slots. The corresponding inner fasteners and fastener retainers are used with the inner frame and shaft holes to secure the hinge shaft from sliding movement. Hinge plates are attached to opposite parts of the cabinet body, for example on the top section and the bottom section of the cabinet body. Each hinge plate. has a portion that extends rearwardly beyond the back of the cabinet body, toward the mounting frame. A hole in each of the extending portions of the hinge plates is slightly larger in diameter than the cylindrical portion of the hinge shafts.

When the present invention is used, the mounting frame is first attached to the wall. The cabinet body is then placed adjacent to the mounting cabinet. The fasteners are moved along the slotted frame holes so that the cylindrical portion of each of the hinge shafts is withdrawn into the mounting frame, the inner fasteners having been removed. The cabinet body is positioned so the holes in the hinge plates are aligned with the hinge shafts in the mounting frame. When the cabinet body is in alignment, the fasteners are moved along the slotted outer frame holes so that the cylindrical portion of each of the hinge shafts extend beyond the top and bottom, for example, of the mounting frame and engage the holes in the extending portions of the hinge plates, thereby attaching the cabinet body to the mounting frame. Once the hinge shafts are in engagement with the holes in the hinge plates, the fastener retainers for the fasteners are tightened, securing the hinge shafts in place. If the cabinet body is to be removed, the inner fasteners are removed and the outer fasteners are loosened so that they slide within the corresponding slotted frame holes. The fasteners are moved along the slots, withdrawing the hinge shafts into the mounting frame and thus detaching the cabinet body from the mounting frame.

In a preferred embodiment, the fasteners are carriage bolts or similar threaded fasteners having a rounded, self-locking head. In this manner, when the cabinet body is attached to the mounting frame and the cabinet is closed, then the fasteners can not be loosened from the exterior of the cabinet, thus providing a secure enclosure in which the store equipment.

In another preferred embodiment, the cabinet body can be removed by withdrawing only one hinge shaft from the extending portion of the hinge plate and then removing the cabinet body from the stationary hinge shaft. Likewise, the cabinet body can be installed on the mounting frame by securing one hinge shaft in the extended position, withdrawing the other hinge shaft into the cabinet body, inserting the stationary hinge shaft through the corresponding hinge plate hole, extending the other hinge shaft thought its respective hinge plate hole and securing the second hinge shaft, thereby securing the cabinet body to the mounting frame.

Further details, features and advantages of the present invention will be understood from the following disclosure of exemplary embodiments with reference to the accompanying drawings.

BRIEF DESCRIPTION OF THE DRAWINGS

FIG. 2 is an exploded left-side view of the mounting frame of FIG. 1 attachable to a wall;

FIG. 3a is an exploded breakaway perspective view of the top of the mounting frame of FIG. 2 illustrating the removal of the hinge shaft and fasteners;

FIG. 3b is a perspective view similar to FIG. 3a showing the hinge shaft secured to the interior of the mounting frame;

FIGS. 6a–6c are cross-sectional views taken along line 6—6 of FIG. 1 illustrating a first method for attaching the cabinet body to the mounting frame in accordance with a preferred embodiment of the present invention; and FIGS. 7a–7c are cross-sectional views taken along line 6—6 of FIG. 1 illustrating a second method for attaching the cabinet body to the mounting frame in accordance with a preferred embodiment of the present invention.

DETAILED DESCRIPTION OF THE PREFERRED EMBODIMENT

Figure 1:
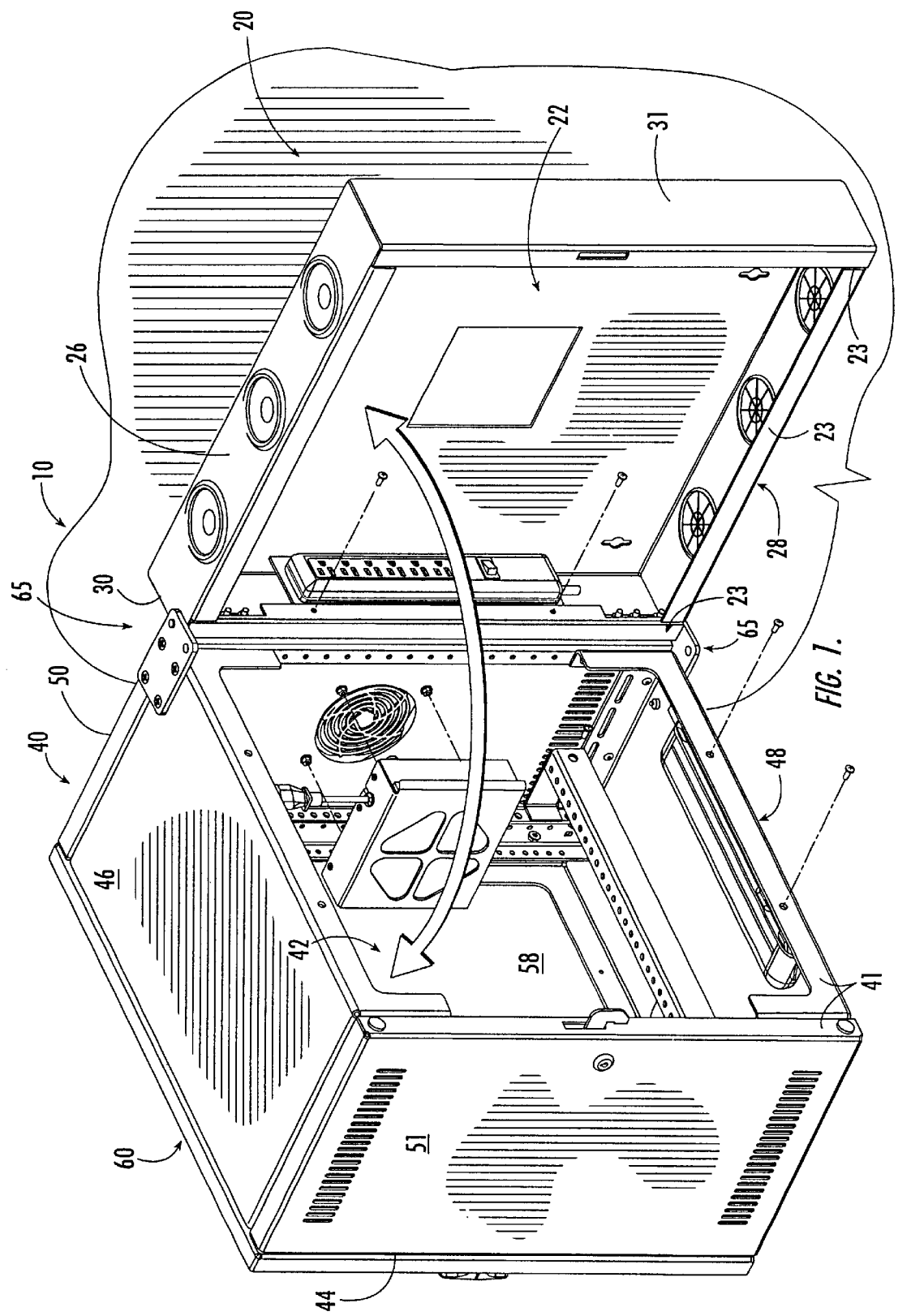
FIG. 1 is a right-side perspective view of a wall mounted cabinet in accordance with a preferred embodiment of the present invention shown with the cabinet body pivotally opened about the hinge shafts.

A wall mounted cabinet 10 in accordance with a preferred embodiment of the present invention, as shown in FIG. 1, has a mounting frame 20, a cabinet body 40, a front cover 60 attached to the cabinet body 40 opposite the mounting frame 20, and a pair of hinge apparatus 65, 66 connecting the cabinet body 40 to the mounting frame 20.

As illustrated in FIG. 2, the mounting frame 20 has a back portion 22, a front portion 24, a top portion 26, a bottom portion 28 and two sides 30, 31. The back portion is attachable to a wall 15 by attachment devices 17, e.g., screws, nails, toggle bolts or the like. The front portion 24 has faces 23 that may be placed in abutment with the cabinet body 40, when the cabinet body 40 is closed against the mounting frame 20. The top portion 26 and the bottom portion 28 are attached to the back portion 22 and the front portion 24. The two sides 30, 31 are attached at each end to the top portion 26 and the bottom portion 28, and to the front portion 24 and the back portion 22 along continuous edges of the two sides 30, 31, thus defining an open area 38 of the mounting frame 20.

Referring again to FIG. 1, the cabinet body 40 has a back portion 42, a front portion 44, top portion 46, a bottom portion 48 and two sides 50, 51. The back portion 42 has faces 41 that correspond to the faces 23 of the front portion 24 of the mounting frame 20 and may be placed in abutment with the faces 23 of the mounting frame 20 when the cabinet body 40 is closed against the mounting frame 40. The top portion 46 and the bottom portion 48 are attached to the back portion 42 and the front portion 44. The two sides 50, 51 are attached at each end to the top portion 46 and the bottom portion 48, and to the front portion 44 and the back portion 42 along continuous edges of the two sides 50, 51, thus defining an open area 58 of the cabinet body 40. Hinges (not shown) attach the front cover 60 to the front 44 of the cabinet body 40.

As shown in FIG. 3a, an opening 34 is formed in the top portion 26 of the mounting frame 20, adjacent to one of the sides 30 and near the front portion 24 of the mounting frame 20. An opening 36 is similarly formed in the bottom portion 28 of the mounting frame 20. The side 30 of the mounting frame 20 adjacent the openings 34, 36, has a first set of vertically aligned frame holes 32 near the top of the side 30 and a second set of vertically aligned frame holes 33 near the bottom of the side 30. The first and second sets of frame holes 32, 33 each has outer frame holes 32a, 33a and an inner frame hole 32b, 33b. The frame attachment holes 32, 33 have rectangular cross-sections and the outer frame holes 32a, 33a, are elongated in the vertical dimension so that they are vertical slots. FIGS. 3a and 3b illustrate the relative disposition of the opening 34 and the first set of frame holes 32a, 32b.

Figure 5:
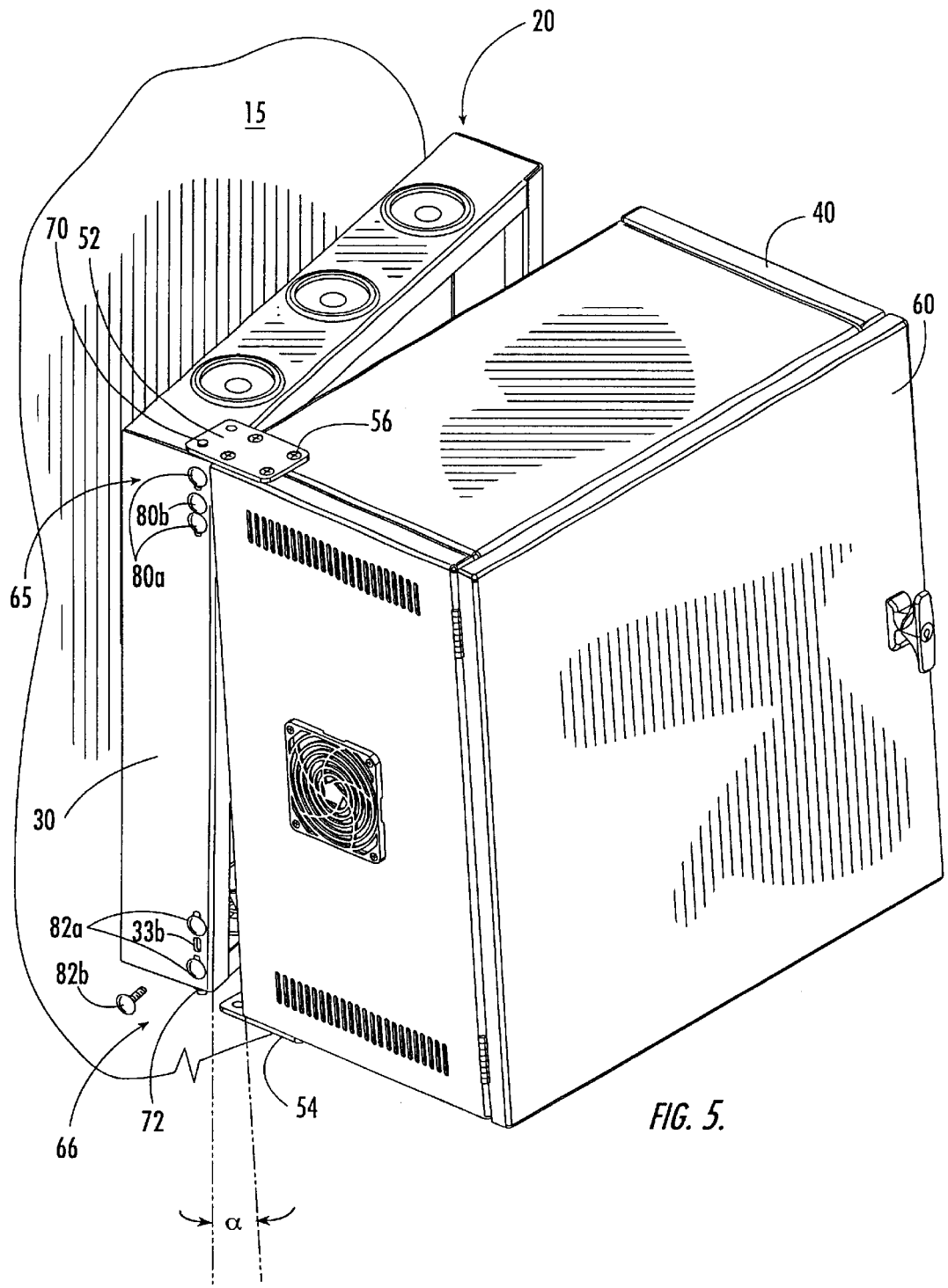
FIG. 5 is a perspective view of the wall mounted cabinet of FIG. 1 showing the cabinet body attached to the mounting frame at the top hinge plate by the hinge shaft and separated from the mounting frame at the bottom hinge plate.

As illustrated in FIGS. 3a and 5, the top hinge apparatus 65 includes a top hinge assembly and a top hinge plate 52. The top hinge assembly has a hinge shaft 70 attached to the side 30 of the mounting frame by fasteners 80 inserted through the frame holes 32 and corresponding shaft holes 74 extending completely through the rectangular portion of the hinge shaft 70. The shaft holes 74 are vertically aligned and spaced at approximately the same interval as the frame holes 32. Fastener retainers 84, attached to the fasteners 80 against the rectangular portion of the hinge shaft, secure the hinge shaft 70 to the fasteners 80. The hinge shaft also has a cylindrical portion which is extensible through the opening 34 in the top portion 26 of the mounting frame 20 to engage the hinge plate 52. The hinge shaft 70, is placed adjacent to the interior surface 30a of the side 30 of the mounting frame 20 and oriented such that the cylindrical portion of the hinge shaft 70 faces the opening 34 in the mounting frame 20.

Figure 4:
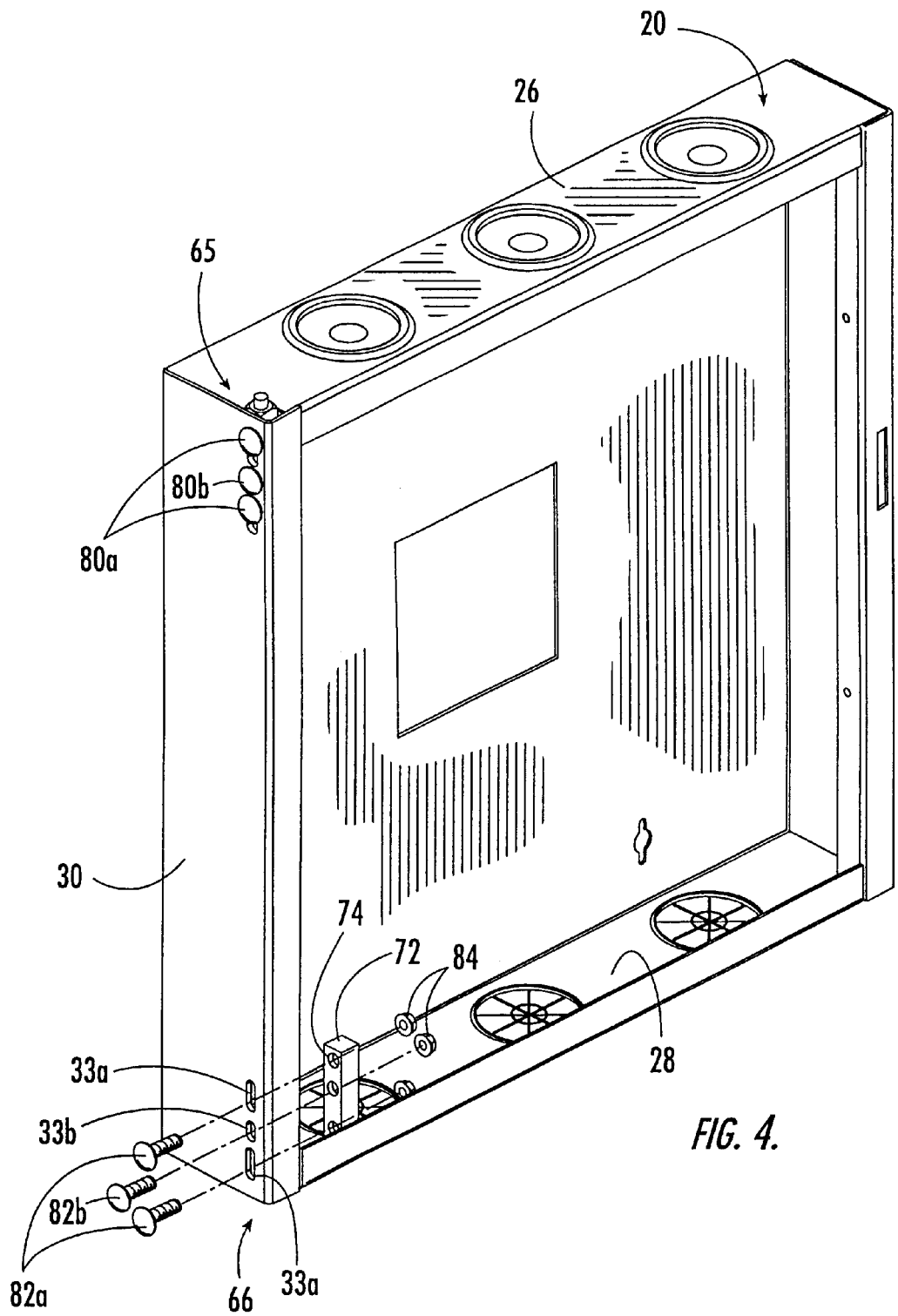
FIG. 4 is an exploded perspective view of the mounting frame of FIG. 2 showing the bottom hinge shaft and fasteners.

As shown in FIGS. 4 and 5, the bottom hinge apparatus 66 similarly includes a bottom hinge assembly and a bottom hinge plate 54. The bottom hinge assembly has a hinge shaft 72 attached to the side 30 of the mounting frame by fasteners 82 inserted through the frame holes 33 and corresponding shaft holes 74 extending completely through the rectangular portion of the hinge shaft 72. The shaft holes 74 are vertically aligned and spaced at approximately the same interval as the frame holes 33. Fastener retainers 84, attached to the fasteners 82 against the rectangular portion of the hinge shaft 72, secure the hinge shaft 72 to the fasteners 82. The hinge shaft 72 also has a cylindrical portion which is extensible through the opening 36 in the bottom portion 28 of the mounting frame 20 to engage the hinge plate 54. The hinge shaft 72, is placed adjacent to the interior surface 30a of the side 30 of the mounting frame 20 and oriented such that the cylindrical portion of the hinge shaft 72 faces the opening 36 in the mounting frame 20.

As illustrated in FIGS. 6 and 7, the top and bottom hinge shafts 70, 72 are placed adjacent the interior surface 30a of the side 30 of the mounting frame and oriented such that the cylindrical portions of the hinge shafts 70, 72 are facing the openings 34, 36 in the top portion 26 and the bottom portion 28 of the mounting frame, as shown in FIGS. 6 and 7. The openings 34, 36 are of sufficient size to accommodate the disposition of the hinge shafts 70, 72 therein. Fasteners 80, 82 are inserted through the frame attachment holes 32 and 33 in the mounting frame 20 and extend through the corresponding shaft holes 74 in the top and bottom hinge shafts 70, 72. The fastener retainers 84 are attached to the fasteners 80, 82 and tightened, thereby securing the hinge shafts 70, 72 to the mounting frame 20. Each set of fasteners 80, 82 includes a pair of outer fasteners 80a, 82a, which correspond to the outer frame holes 32a, 33a and an inner fastener 80b, 82b which correspond to the inner frame holes 32b, 33b. The inner fasteners 80b, 82b can be removed and the outer fasteners 80a, 82a loosened, allowing the hinge shafts 70, 72 to be slidably adjusted along the length of the outer frame holes 32a, 33a. This permits the cylindrical portion of each hinge shaft 70, 72 to be extended through the openings 34, 36, in the top and bottom portions 26, 28 of the mounting frame 20 to engage the hinge plates 52, 54 or to be retracted through the openings 34, 36 into to open area 38 of the mounting frame 20, thus disengaging from the hinge plates 52, 54.

The top and bottom hinge plates 52, 54 are fixedly attached by fasteners 56 to the rear corners of the top portion 46 and the bottom portion 48 of the cabinet body 40 on the side 50 of the cabinet body 40 corresponding to the frame holes 32, 33 in the mounting frame 20. Portions of the hinge plates 52, 54 extend rearward beyond the back portion 42 of the cabinet body 40. Each extending portion of the hinge plates 52, 54 has a hinge hole 53, 55 that extends the thickness of the hinge plates 52, 54. The hinge engagement holes 53, 55 are of sufficient size such the cylindrical portions of the hinge shafts 70, 72 can easily pass through the hinge engagement holes 53, 55 when the hinge shafts 70, 72 are in the engagement position.

In use, the mounting frame 20 without the cabinet body 40 is attached to a wall 15 with attachment devices 17 as shown in FIG. 2. The next steps are illustrated in FIGS. 6a–6c. If the hinge shafts 70, 72 are already installed in the mounting frame 20, then fastener retainers 84 on the inner fasteners 80b, 82b are removed and the inner fasteners 80b, 82b are withdrawn from the corresponding shaft holes 74 and the inner frame holes 32b, 33b. The fastener retainers 84 of the outer fasteners 80a, 82a are loosened, allowing the outer fasteners 80a, 82a to slide along the length of the outer frame holes 32a, 33a. Thus, the hinge shafts 70, 72, attached to the outer fasteners 80a, 82a, are adjusted such that the cylindrical portions of the hinge shafts 70, 72 are retracted through the openings 34, 36 in the top portion 26 and bottom portion 28 of the mounting frame 20 and into the open area 38 of the mounting frame 20. The back 42 of the cabinet body 40 is placed against the front 24 of the mounting frame 20 and the hinge holes 53, 55 are aligned with the openings 34, 36 in the mounting frame 20. The hinge shafts 70, 72 are moved such that the cylindrical portions pass through the openings 34, 36 and into the engagement with the hinge holes 53, 55. The inner fasteners 80b, 82b are inserted into the inner frame holes 32b, 33b and through the respective shaft holes 74. The inner fasteners 80b, 82b are retained against hinge shafts 70, 72 by the respective fastener retainers 84, securing the hinge shafts 70, 72 to the side 30 of the mounting frame 20. The outer fasteners 80a, 82a are then secured, thus securing the cabinet body 40 to the mounting frame 20. The hinge shafts 70, 72 can be moved to engage the hinge hole 53, 55 in the respective hinge plate 52, 54 simultaneously or separately.

By following the above method, the cabinet body 40 is thus securely attached to the mounting frame 20. The cabinet body 40 can then be pivoted about the hinge shafts 70, 72 thereby allowing the cabinet body 40 to be opened without detaching it from the mounting frame 20. If the cabinet body 40 is to be detached from the mounting frame 20, then the process is reversed as follows. First, the inner fasteners 80b, 82b are removed and the outer fasteners 80a, 82a are loosened. The hinge shafts 70, 72 are then retracted through the respective opening 34, 36 and into the open area 38 of the mounting frame 20. The cabinet body 40 is then removed.

In a second preferred method, shown in FIGS. 5 and 7a–7c, one hinge shaft, e.g., the top hinge shaft 70, is first extended through the top opening 34 and secured in position by the respective fasteners 80. The bottom hinge shaft 72 remains retracted into the open area 38 of the mounting frame 20. The cabinet body 40 may then be attached by aligning the hinge hole 53 in the top hinge plate 52 with the cylindrical portion of the top hinge shaft 70 and placing the cabinet body 40 such that the cylindrical portion of the top hinge shaft 70 engages the hinge hole 53. The engagement between the top hinge shaft 70 and the hinge engagement hole 53 in the top hinge plate 52 is such that an angle $\alpha$ can exist between the front 24 of the mounting frame 20 and the back 42 of the cabinet body 40 after the hinge shaft 70 is inserted into the hinge hole 53. The inner fastener 82b for the bottom hinge shaft 72 is removed and the outer fasteners 82a are loosened, thus allowing the bottom hinge shaft 72 to slide along the outer set of frame holes 33a. The bottom hinge hole 55 in the bottom hinge plate 54 and the opening 36 in the bottom portion 28 of the mounting cabinet 20 are aligned, and the bottom hinge shaft 72 is moved so that the cylindrical portion 72b of the bottom hinge 72 extends through the opening 36 and into the bottom hinge hole 55. The inner fastener 82b is inserted and the fasteners 82 for the bottom hinge shaft 72 are tightened, thereby securing the cabinet body 40 to the mounting frame 20. Likewise, the cabinet body 40 can be detached from the mounting frame 20 by retracting one of the hinge shafts, e.g., the bottom hinge shaft 72, from the bottom hinge hole 55 and the opening 36 into the open area 38 of the mounting frame 20 and moving the cabinet body 40 such that the top hinge hole 53 is disengaged from the top hinge shaft 70. It will be obvious to one of ordinary skill in the art that although this method is illustrated with the top hinge shaft being extended and secured first, this method works with either hinge shaft 70, 72 extended and secured first.

In the preferred embodiment, the fasteners 80, 82 are carriage bolts sized to engage the rectangular cross-section of the frame holes 32, 33.

Although illustrated as a separate feature, the hinge plates 52, 54 may be integral to the cabinet body 40.

It will therefore be readily understood by those persons skilled in the art that the present invention is susceptible of broad utility and application. Many embodiments and adaptations of the present invention other than those herein described, as well as many variations, modifications and equivalent arrangements, will be apparent from or reasonably suggested by the present invention and the foregoing description thereof, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the claims appended hereto and the equivalents thereof.

What is claimed is:

1. A wall mounted cabinet, comprising:
    a mounting frame for attachment to a wall,
    a cabinet body,
    a cover connected to the cabinet body, and
    at least one hinge apparatus having a hinge assembly retained on the mounting frame, the hinge assembly having a hinge shaft that slides between a first position extending through an opening of the mounting frame for engaging an opening in a hinge plate connected to the cabinet body for retention of the cabinet body on the mounting frame in a pivotal disposition relative to the frame, and a second position withdrawn from the opening of the mounting frame and the opening in the hinge plate for detachment of the cabinet body from the mounting frame, the hinge shaft being accessible for slideable movement only from an interior of the mounting frame and the cabinet body, thereby preventing unauthorized detachment of the cabinet body from the mounting frame.

2. A wall mounted cabinet having an improved hinge mechanism attaching a cabinet body to a mounting frame, the improvement comprising at least one hinge mechanism attaching the cabinet body to the mounting frame, each hinge mechanism comprising a hinge shaft assembly retained on a first side of the mounting frame and a hinge plate fixedly attached to the cabinet body, the hinge shaft assembly comprising
    outer frame holes and an inner frame hole forming a set of frame holes penetrating a side of the mounting frame in proximity to an opening in the mounting frame, the outer holes aligned with the inner hole, the outer holes being elongate to form slots having a defined length;
    a hinge shaft having a first portion and a second portion, the first portion being oriented toward the at least one opening in the mounting frame, the second portion having a plurality of shaft holes formed therein, the shaft holes being in a spaced alignment corresponding to the outer holes and the inner hole; and
    fasteners insertable through the inner hole and outer holes, respectively, and into the plurality of shaft holes, retaining the hinge shaft against the first side of the mounting frame,
    the hinge shaft slideably adjustable between a first position extending through the opening in the mounting frame and into engagement with the hinge plate pivotally connecting the cabinet body to the mounting frame and a second position withdrawn from the hinge plate and the opening in the mounting frame, disconnecting the shaft from the hinge plate.

3. The wall mounted cabinet according to claim 2 wherein the hinge shaft assembly further comprises
    the outer set and the inner set of frame holes being in vertical alignment, the outer set of frame holes forming vertical slots;
    the first portion of the hinge shaft is cylindrical with a defined diameter, the second portion of the hinge shaft is having a first side and a second side opposite the first side, the plurality of shaft holes penetrating the first side of the rectangular portion and extending through the second side of the rectangular portion of the hinge shaft, the hinge shaft being oriented such that the first side of the rectangular portion is adjacent to the first side of the mounting frame;
    the inner and outer shaft fasteners traveling through the plurality of shaft holes in the rectangular portion of the hinge shaft to extend beyond the second side of the rectangular portion of the hinge shaft; and
    an outer set of fastener retainers and an inner set of fastener retainers removably attached to the outer and inner set of shaft fasteners, respectively, when the outer and inner shaft fasteners extend beyond the second side of the rectangular portion of the hinge shaft, the outer and inner fastener retainers attached to the corresponding outer and inner shaft fasteners adjacent to the second side of the rectangular portion of the hinge shaft, to retain the hinge shaft in position against the first side of the mounting frame.

4. The wall mounted cabinet according to claim 2 wherein the hinge plate of the at least one hinge mechanism comprises a plate having a portion extending rearwardly from the cabinet body such that when the cabinet body is placed in attaching position relative to the mounting frame, the extending portion of the plate reaches across the at least one opening in the mounting frame, the plate being attached to the cabinet body in a location adjacent to the first side of the mounting frame, a hole penetrating the extending portion of the plate and being located on the extending portion of the plate such that said hole in the extending portion is in alignment with the opening in the mounting frame when the cabinet body is placed in attaching position relative to the mounting frame, said hole having a diameter slightly larger than the diameter of the cylindrical portion of the hinge shaft.

5. The wall mounted cabinet according to claim 3 wherein the outer set of fastener retainers having been loosened, the inner set of fastener having been removed from the shaft holes and the frame holes after removal of the retainers corresponding to the inner shaft fasteners, the hinge shaft being moveable a distance corresponding to the length of the slots of the outer set of frame holes for slideable adjustment between the first position through the at least one opening in the mounting frame and into engagement with said hole in the hinge plate, and the second position whereby the hinge shaft is withdrawn from said hole in the hinge plate and the at least one opening in the mounting frame, the inner set of shaft fasteners inserted into the frame holes and the shaft holes and having the corresponding fastener retainers attached, retaining the hinge shaft in position against the first side of the mounting frame.

6. The wall mounted cabinet according to claim 3 wherein the outer and inner shaft fasteners are threaded and the outer and inner fastener retainers are threaded for removable attachment to the outer and inner shaft fasteners.

7. The wall mounted cabinet according to claim 6 wherein the outer and inner shaft fasteners are carriage bolts and the outer and inner fastener retainers are nuts.

8. The wall mounted cabinet according to claim 2 wherein the at least one opening in the mounting frame is located on a top section of the mounting frame.

9. The wall mounted cabinet according to claim 2 wherein the at least one opening in the mounting frame is located on a bottom section of the mounting frame.

10. The wall mounted cabinet according to claim 2 wherein the at least one opening is a first opening on a top section of the mounting frame, a first hinge mechanism associated therewith, and a second opening on a bottom section of the mounting, a second hinge mechanism employed with the second opening.

11. A wall mounted cabinet comprising:
a mounting frame attachable to a wall;
a cabinet body attachable to the mounting frame;
and a cover attached to the cabinet body opposite the mounting frame;
at least one hinge mechanism for attaching the cabinet body to the mounting frame, the at least one hinge mechanism comprising a hinge shaft assembly retained on a first side of the mounting frame and a hinge plate fixedly attached to the cabinet body, the hinge shaft assembly including a hinge shaft in slideable adjustment between a first position extending through an at least one opening in the mounting frame and into communication with the hinge plate for attaching the cabinet body in a pivotal disposition relative to the mounting frame, and a second position withdrawn from the hinge plate and the at least one opening in the mounting frame, detaching the cabinet body from the mounting frame;
the hinge shaft assembly further comprising
an outer set and an inner set of frame holes penetrating the first side of the mounting frame in proximity to the opening in the mounting frame, the outer set and the inner set of frame holes in vertical alignment, the outer set of frame holes being vertically elongate to form slots having a defined length;
the hinge shaft having a cylindrical portion with a defined diameter and a rectangular portion, the hinge shaft oriented such that the cylindrical portion faces the opening in the mounting frame, the rectangular portion having a first side and a second side opposite the first side, a plurality of shaft holes penetrating the first side of the rectangular portion and extending through the second side of the rectangular portion of the hinge shaft, the shaft holes being in a spaced vertical alignment corresponding to the first set and the second set of frame holes, the hinge shaft being oriented such that the first side of the rectangular portion is adjacent to the first side of the mounting frame;
an outer set of shaft fasteners and an inner set of shaft fasteners, said inner and outer shaft fasteners insertable into the inner and outer frame holes, respectively, and through the rectangular portion of the hinge shaft to extend beyond the second side of the rectangular portion of the hinge shaft;
an outer set of fastener retainers and an inner set of fastener retainers removably attached to the outer and inner set of shaft fasteners, respectively, when the outer and inner shaft fasteners extend beyond the second side of the rectangular portion of the hinge shaft, the outer and inner fastener retainers attached to the corresponding outer and inner shaft fasteners adjacent to the second side of the rectangular portion of the hinge shaft, retaining the hinge shaft in position against the first side of the mounting frame;
the hinge plate of the at least one hinge mechanism further comprising:
a plate having a portion extending rearwardly from the cabinet body such that when the cabinet body is placed in attaching position relative to the mounting frame, the extending portion of the plate travels across the at least one opening in the mounting frame, the plate being attached to the cabinet body in a location adjacent to the first side of the mounting frame, a hole penetrating the extending portion of the plate and being located on the extending portion of the plate such that said hole in the extending portion is in alignment with the at least one opening in the mounting frame, said hole having a diameter slightly larger than the diameter of the cylindrical portion of the hinge shaft when the cabinet body is placed in attaching position relative to the mounting frame; and wherein the outer set of fastener retainers having been loosened, the inner set of fastener retainers removed from the inner set of shaft fasteners and the inner set of shaft fasteners removed from the shaft holes and the inner set of frame holes, the hinge shaft being moveable a distance corresponding to the length of the slots of the outer set of frame holes for slideable adjustment between the first position through the at least one opening in the mounting frame and into engagement with said hole in the hinge plate, and the second position whereby the hinge shaft is withdrawn from said hole in the hinge plate and the at least one opening in the mounting frame, the inner set of shaft fasteners inserted into the frame holes and the shaft holes, the inner set of fastener retainers attached to said inner set of shaft fasteners, and the inner and outer shaft fasteners secured against the second side of the rectangular portion of the hinge shaft, thereby retaining the hinge shaft in position against the first side of the mounting frame.

12. The wall mounted cabinet according to claim 11 wherein the outer and inner shaft fasteners are threaded and the outer and inner fastener retainers are threaded for removable attachment to the outer and inner shaft fasteners.

13. The wall mounted cabinet according to claim 12 wherein the outer and inner shaft fasteners are carriage bolts and the outer and inner fastener retainers are nuts.

14. The wall mounted cabinet according to claim 11 wherein the at least one opening in the mounting frame is located on a top section of the mounting frame.

15. The wall mounted cabinet according to claim 11 wherein the at least one opening in the mounting frame is located on a bottom section of the mounting frame.

16. The wall mounted cabinet according to claim 11 wherein the at least one opening is a first opening on a top section of the mounting frame, a first hinge mechanism associated therewith, and a second opening on a bottom section of the mounting frame, a second hinge mechanism employed with the second opening.

17. A hinge mechanism for use on a cabinet having a cabinet body attachable to a frame, the frame having an opening in proximity to a first side, the frame further having an outer set and an inner set of frame holes penetrating the first side of the mounting frame in proximity to the opening in the mounting frame, the outer set and the inner set of frame holes in vertical alignment, the outer set of frame holes being vertically elongate to form slots having a defined length, the hinge mechanism comprising:

a hinge shaft assembly and a hinge plate, the hinge shaft assembly retained on the first side of the frame, the hinge shaft assembly having a hinge shaft in slideable engagement with the hinge plate fixedly attached to the cabinet body, the hinge shaft extending through the opening in the frame and engaging the hinge plate.

18. The hinge mechanism according to claim 17 wherein the hinge shaft assembly further comprises the hinge shaft having a cylindrical portion with a defined diameter and a rectangular portion, the hinge shaft oriented such that the cylindrical portion faces the opening in the frame, the rectangular portion having a first side and a second side opposite the first side, a plurality of shaft holes penetrating the first side of the rectangular portion and extending through the second side of the rectangular portion of the hinge shaft, the shaft holes being in a spaced vertical alignment corresponding to the outer set and the inner set of frame holes, the hinge shaft being oriented such that the first side of the rectangular portion is adjacent to the first side of the frame;

an outer set of shaft fasteners and an inner set of shaft fasteners, said inner and outer shaft fasteners insertable into the inner and outer frame holes, respectively, and through the rectangular portion of the hinge shaft to extend beyond the second side of the rectangular portion of the hinge shaft; and an outer set of fastener retainers and an inner set of fastener retainers removably attached to the outer and inner set of shaft fasteners, respectively, such that when the outer and inner shaft fasteners extend beyond the second side of the rectangular portion of the hinge shaft, the outer and inner fastener retainers attach to the corresponding outer and inner shaft fasteners adjacent to the second side of the rectangular portion of the hinge shaft, retaining the hinge shaft in position against the first side of the frame.

19. The hinge mechanism according to claim 17 wherein the hinge plate further comprises a portion extending rearwardly from the cabinet body such that when the cabinet body is placed in attaching position relative to the frame, the extending portion of the hinge plate travels across the opening in the frame, the extending portion having a hole therein, said hole positioned on the extending portion such that said hole is in alignment with the opening in the frame shaft when the cabinet body is placed in attaching position relative to the mounting frame, said hole having a size sufficient to engage the hinge shaft when the cabinet body is attached to the frame.

20. The hinge mechanism according to claim 18 wherein the hinge shaft is slidably adjustable by loosening the outer set of fastener retainers, removing the inner set of fastener retainers and removing the inner set of shaft fasteners from the shaft holes and the inner set of frame holes, the hinge shaft being adjustable a distance corresponding to the length of the slots of the outer set of frame holes, the hinge shaft slidably adjustable between the first position through the opening in the frame and into engagement with the hinge plate, and the second position whereby the hinge shaft is disengaged from the hinge plate and withdrawn through the opening in the frame, the inner set of shaft fasteners inserted into the frame holes and the shaft holes, the inner set of fastener retainers attached to the inner set of shaft fasteners and the inner and outer shaft fasteners retained against the second side of the rectangular portion of the hinge shaft by the inner and outer fastener retainers, thereby securing the hinge shaft in position against the first side of the mounting frame in the desired position.

21. The hinge mechanism according to claim 17 wherein the outer and inner shaft fasteners are threaded and the outer and inner fastener retainers are threaded for removable attachment to the outer and inner shaft fasteners.

22. The hinge mechanism according to claim 21 wherein the outer and inner shaft fasteners are carriage bolts and the outer and inner fastener retainers are nuts.

23. A wall mounted cabinet, comprising:

a mounting frame for attachment to a wall, a cabinet enclosure, and at least one hinge apparatus having a hinge assembly retained on the mounting frame, the hinge assembly having a hinge shaft that slides between a first position extending through an opening of the mounting frame for engaging an opening in a hinge plate connected to the cabinet enclosure for retention of the cabinet enclosure on the mounting frame in a pivotal disposition relative to the frame, and a second position withdrawn from the opening of the mounting frame and the opening in the hinge plate for detachment of the cabinet enclosure from the mounting frame, the hinge shaft being accessible for slideable movement only from an interior of the mounting frame and the cabinet enclosure, thereby preventing unauthorized detachment of the cabinet enclosure from the mounting frame.

* * * * *